United States Patent
Wang et al.

(10) Patent No.: US 6,331,954 B1
(45) Date of Patent: Dec. 18, 2001

(54) DETERMINATION OF MISALIGNMENT FOR FLOATING GATES NEAR A GATE STACK BENDING POINT IN ARRAY OF FLASH MEMORY CELLS

(75) Inventors: John J. Wang; Jiang Li, both of San Jose; Yider Wu, Campbell, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/894,777

(22) Filed: Jun. 28, 2001

(51) Int. Cl.[7] .................................................. G11C 16/34
(52) U.S. Cl. .............................. 365/185.29; 365/185.33
(58) Field of Search ....................... 365/185.09, 185.33, 365/185.29, 201

(56) References Cited

U.S. PATENT DOCUMENTS

| | | | |
|---|---|---|---|
| 5,699,296 | * 12/1997 | Song | 365/185.22 |
| 5,991,205 | * 11/1999 | Hara | 365/185.29 |
| 6,154,808 | * 11/2000 | Nagase et al. | 711/103 |
| 6,166,961 | * 12/2000 | Lee et al. | 365/185.29 |
| 6,229,736 | * 5/2001 | Song | 365/185.29 |

* cited by examiner

Primary Examiner—Andrew Q. Tran
(74) Attorney, Agent, or Firm—Monica H. Choi (57) ABSTRACT

For electrically determining the level of misalignment of floating gate structures closest to a gate stack bending point in an array of flash memory cells, a plurality of test flash memory cells are formed with each test flash memory cell having a respective floating gate structure designed to be disposed a respective displacement distance from a respective gate stack bending point. An erase operation is performed for each of the test flash memory cells by biasing the test flash memory cells with voltages from a plurality of voltage sources. Each of the test flash memory cells are then biased with test voltages from the plurality of voltage sources. A respective current meter then measures a respective amount of current flowing through each of the test flash memory cells when biased with the test voltages. The level of misalignment is determined depending on which of the test flash memory cells conducts a current level that is greater than a threshold current level when biased with the test voltages. The level of misalignment is approximately equal to a highest one of the respective displacement distance corresponding to one of the test flash memory cells that conducts a current level that is greater than the threshold current level.

22 Claims, 9 Drawing Sheets

FIG. 13

DETERMINATION OF MISALIGNMENT FOR FLOATING GATES NEAR A GATE STACK BENDING POINT IN ARRAY OF FLASH MEMORY CELLS

BACKGROUND OF THE INVENTION

1. Field of the Invention

The present invention relates generally to fabrication of an array of flash memory cells for non-volatile memory devices, and more particularly, to a method and system for determining a level of misalignment of floating gate structures closest to a gate stack bending point in the array of flash memory cells.

2. Discussion of the Related Art

Figure 1:
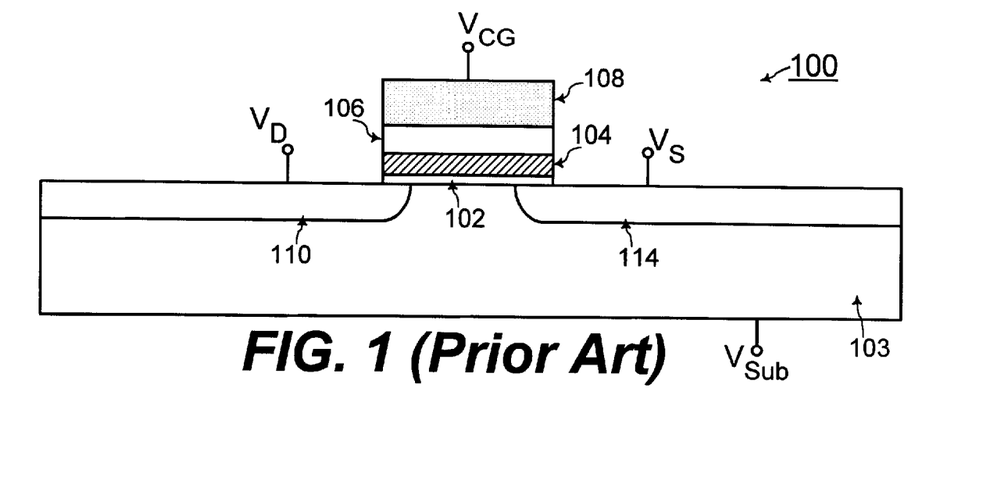
FIG. 1 shows a cross-sectional view of a flash memory cell, according to the prior art.

Referring to FIG. 1, a flash memory cell 100 of a non-volatile flash memory device includes a tunnel dielectric structure 102 typically comprised of silicon dioxide ($SiO_2$) or nitrided oxide as known to one of ordinary skill in the art of integrated circuit fabrication. The tunnel dielectric structure 102 is disposed on a semiconductor substrate or a p-well 103. In addition, a floating gate structure 104, comprised of a conductive material such as polysilicon for example, is disposed over the tunnel dielectric structure 102. A floating dielectric structure 106, typically comprised of silicon dioxide ($SiO_2$), is disposed over the floating gate structure 104. A control gate structure 108, comprised of a conductive material, is disposed over the floating dielectric structure 106.

A drain bit line junction 110 that is doped with a junction dopant, such as arsenic (As) or phosphorous (P) for example, is formed within an active device area of the semiconductor substrate or p-well 103 toward a left sidewall of the floating gate structure 104 in FIG. 1. A source bit line junction 114 that is doped with the junction dopant is formed within the active device area of the semiconductor substrate or p-well 106 toward a right sidewall of the floating gate structure 104 of FIG. 1.

During the program or erase operations of the flash memory cell 100 of FIG. 1, charge carriers are injected into or injected out of the floating gate structure 104. Such variation of the amount of charge carriers within the floating gate structure 104 alters the threshold voltage of the flash memory cell 100, as known to one of ordinary skill in the art of flash memory technology.

For example, when electrons are the charge carriers that are injected into the floating gate structure 104, the threshold voltage increases. Alternatively, when electrons are the charge carriers that are injected out of the floating gate structure 104, the threshold voltage decreases. These two conditions are used as the two states for storing digital information within the flash memory cell 100, as known to one of ordinary skill in the art of electronics.

During programming of the flash memory cell 100 for example, a voltage of +9 Volts is applied on the control gate structure 108, a voltage of +5 Volts is applied on the drain bit line junction 110, and a voltage of 0 Volts is applied on the source bit line junction 114 and on the semiconductor substrate or p-well 103. With such bias, when the flash memory cell 100 is an N-channel flash memory cell, electrons are injected into the floating gate structure 104 to increase the threshold voltage of the flash memory cell 100 during programming of the flash memory cell 100.

Alternatively, during erasing of the flash memory cell 100, a voltage of −9.5 Volts is applied on the control gate structure 108, a voltage of 0 Volts is applied on the drain bit line junction 110, and a voltage of +4.5 Volts is applied on the source bit line junction 114 and on the semiconductor substrate or p-well 103 for example. With such bias, when the flash memory cell 100 is an N-channel flash memory cell, electrons are pulled out of the floating gate structure 104 to decrease the threshold voltage of the flash memory cell 100 during erasing of the flash memory cell 100. Such an erase operation is referred to as an edge erase process by one of ordinary skill in the art of non-volatile flash memory technology.

In an alternative channel erase process, a voltage of −9.5 Volts is applied on the control gate structure 108 and a voltage of +9 Volts is applied on the semiconductor substrate or p-well 103 with the drain and source bit line junctions 110 and 114 floating. With such bias during the erase operation, when the flash memory cell 100 is an N-channel flash memory cell, electrons are pulled out of the floating gate structure 104 to the substrate or p-well 103 to decrease the threshold voltage of the flash memory cell 100 during erasing of the flash memory cell 100.

Figure 2:
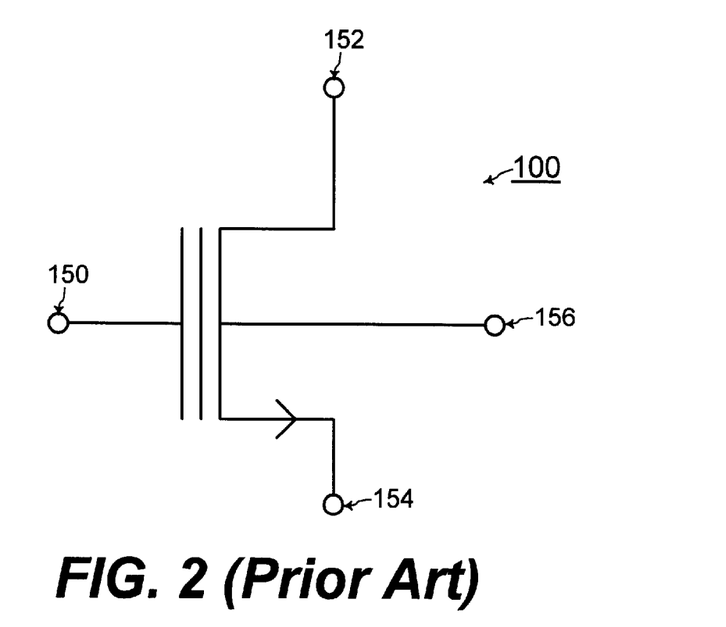
FIG. 2 shows a circuit diagram representation of the flash memory cell of FIG. 1, according to the prior art.
Figure 3:
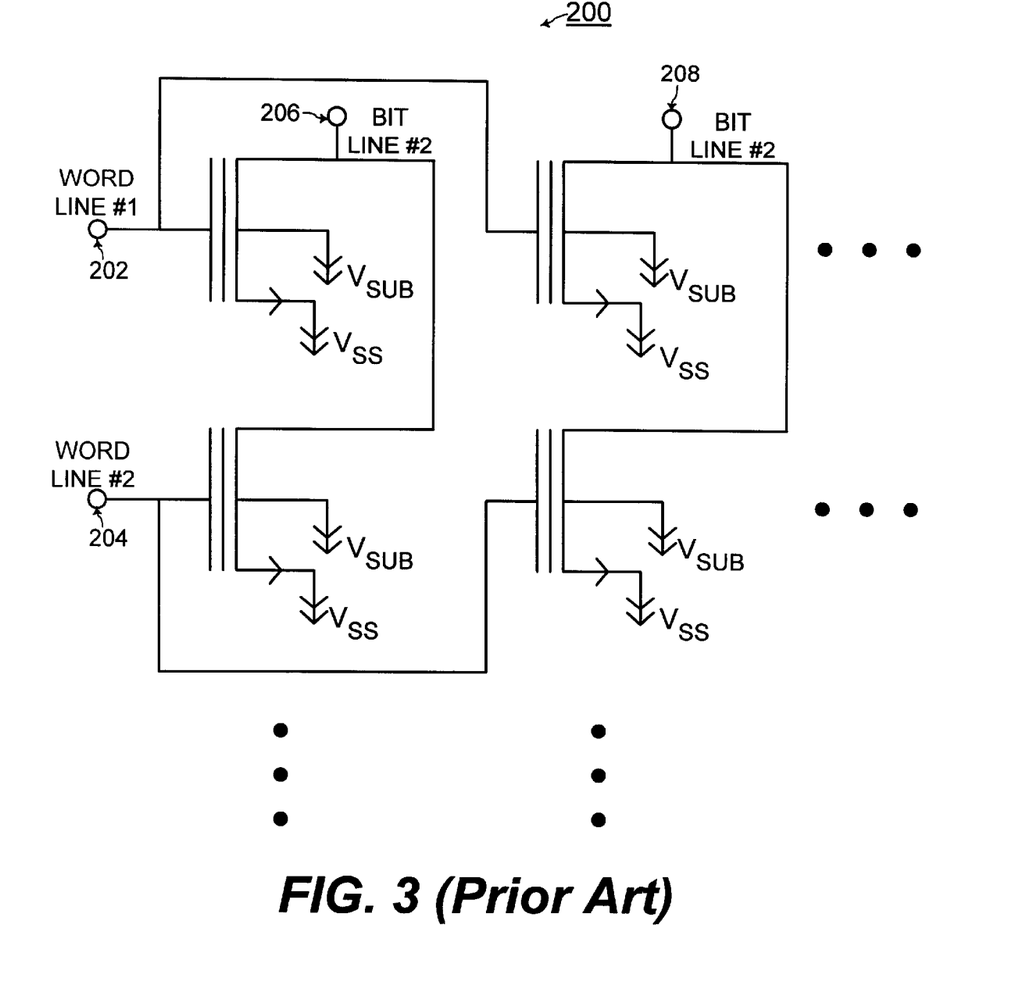
FIG. 3 shows a configuration of an array of flash memory cells forming a nonvolatile flash memory device, according to the prior art.

FIG. 2 illustrates a circuit diagram representation of the flash memory cell 100 of FIG. 1 including a control gate terminal 150 coupled to the control gate structure 108, a drain terminal 152 coupled to the drain bit line junction 110, a source terminal 154 coupled to the source bit line junction 114, and a substrate or p-well terminal 154 coupled to the substrate or p-well 103. FIG. 3 illustrates an electrically erasable and programmable memory device 200 comprised of an array of flash memory cells, as known to one of ordinary skill in the art of flash memory technology. Referring to FIG. 3, the array of flash memory cells 200 includes rows and columns of flash memory cells with each flash memory cell having similar structure to the flash memory cell 100 of FIGS. 1 and 2. The array of flash memory cells 200 of FIG. 3 is illustrated with 2 columns and 2 rows of flash memory cells for simplicity and clarity of illustration. However, a typical array of flash memory cells comprising an electrically erasable and programmable memory device has more numerous rows and columns of flash memory cells such as 512 rows and 512 columns of flash memory cells for example.

In any case, further referring to FIG. 3, in the array of flash memory cells 200 comprising an electrically erasable and programmable memory device, the control gate terminals of all flash memory cells in a row of the array are coupled together to form a respective word line for that row. In FIG. 3, the control gate terminals of all flash memory cells in the first row are coupled together to form a first word line 202, and the control gate terminals of all flash memory cells in the second row are coupled together to form a second word line 204.

In addition, the drain terminals of all flash memory cells in a column are coupled together to form a respective bit line for that column. In FIG. 3, the drain terminals of all flash memory cells in the first column are coupled together to form a first bit line 206, and the drain terminals of all flash memory cells in the second column are coupled together to form a second bit line 208. Further referring to FIG. 3, the source terminal of all flash memory cells of the array 200 are coupled together to a source voltage $V_{SS}$, and the substrate or p-well terminal of all flash memory cells of the array 200 are coupled together to a substrate voltage $V_{SUB}$.

Figure 4:
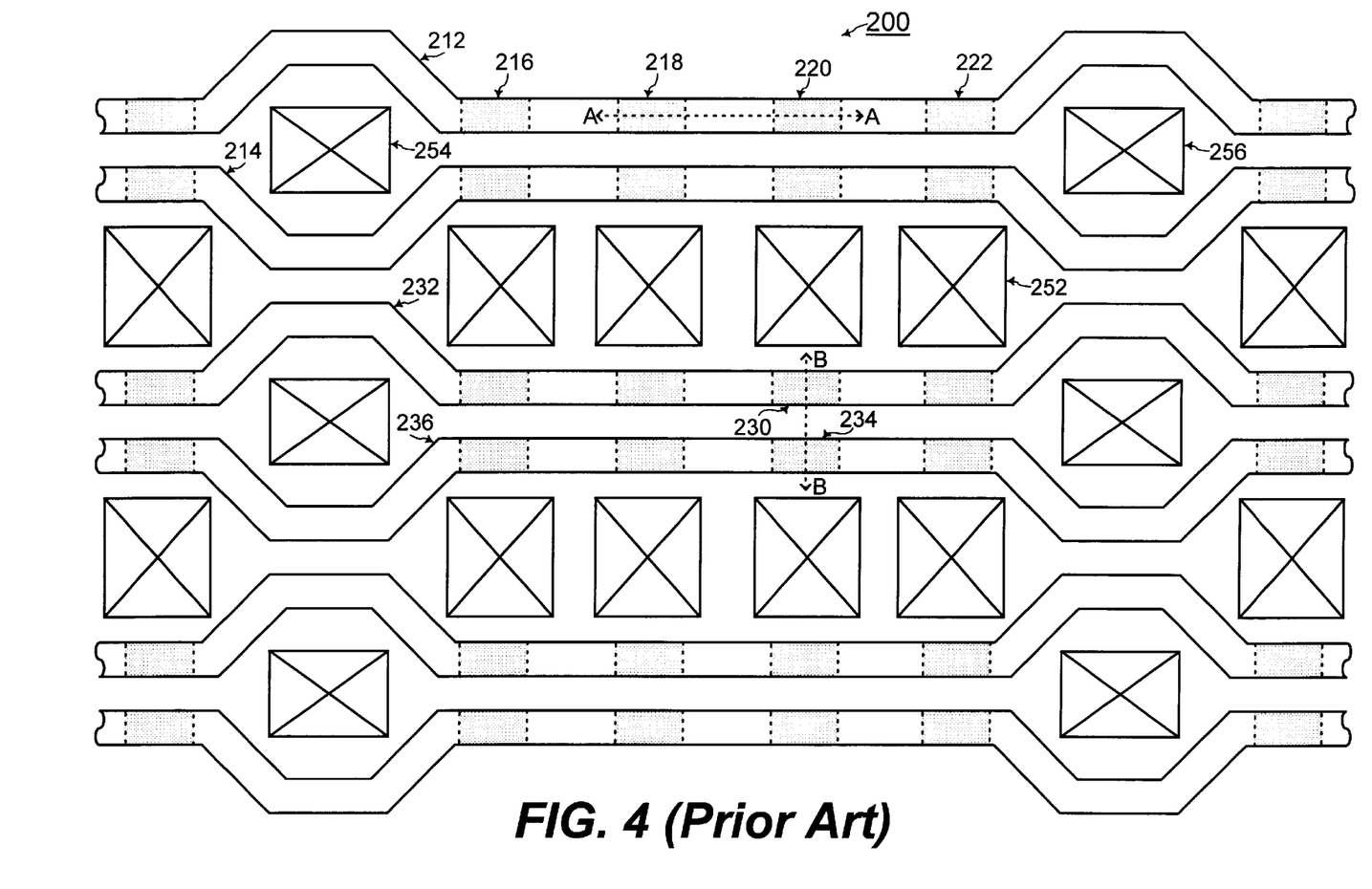
FIG. 4 shows a lay-out of the array of flash memory cells, according to the prior art.

FIG. 4 illustrates the lay-out for forming the array of flash memory cells 200. In FIG. 4, the control gate structure for a row of flash memory cells is continuous including a first control gate structure 212 for the first row of flash memory cells and a second control gate structure 214 for the second row of flash memory cells. Each flash memory cell within a row is defined by a floating gate structure patterned below the control gate structure of that row. For example, the first row of flash memory cells of FIG. 4 includes a first floating gate structure 216, a second floating gate structure 218, a third floating gate structure 220, and a fourth floating gate structure 222.

Figure 5:
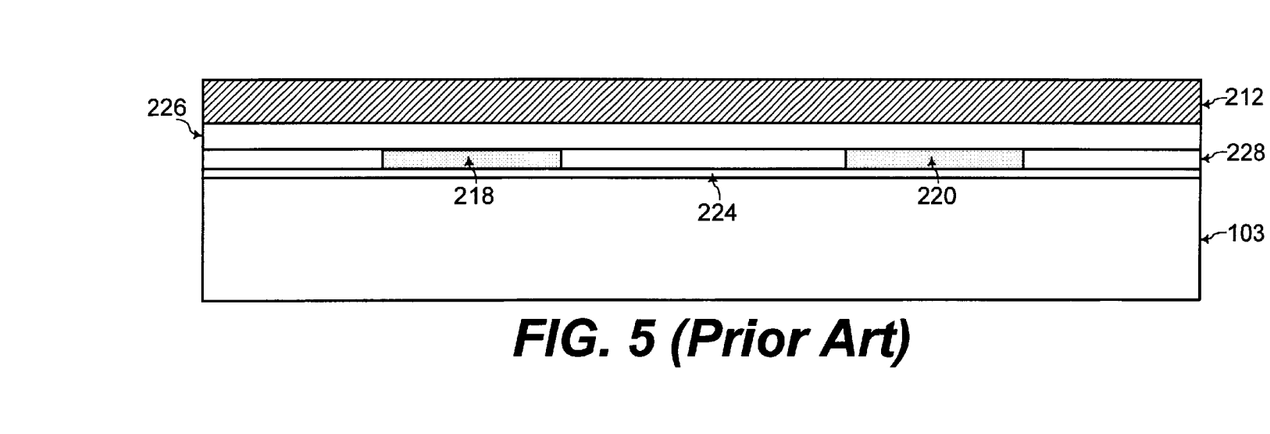
FIG. 5 shows a cross-sectional view of two floating gate structures disposed under a continuous control gate structure of FIG. 4, according to the prior art.

FIG. 5 shows the cross-sectional view of the gate stack formed under the first control gate structure 212 across dashed line A—A in FIG. 4. Such a gate stack includes a tunnel dielectric structure 224 similar to the tunnel dielectric structure 102 of FIG. 1, and includes a floating dielectric structure 226 similar to the floating dielectric structure 106 of FIG. 1. The floating dielectric structure 226 is disposed between the control gate structure 212 and the floating gate structures 218 and 220. The floating gate structures 216, 218, 220, and 222 are electrically isolated from each other by a layer of insulating material 228.

Each of the control gate structures in FIG. 4 including the first and second control gate structures 212 and 214 have a plurality of floating gate structures defined within the gate stack formed under a control gate structure. Each of the floating gate structures defines a respective flash memory cell. The drain bit line junction and the source bit line junction of a flash memory cell are formed within the semiconductor substrate adjacent the respective floating gate structure corresponding to the flash memory cell.

Figure 6:
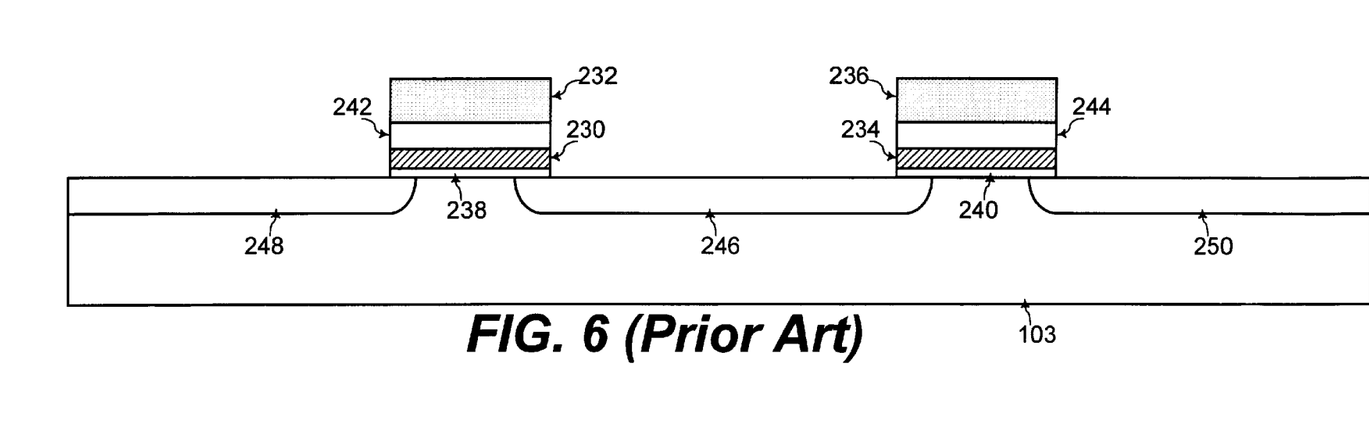
FIG. 6 shows a cross-sectional view of two floating gate structures sharing a source bit line junction and disposed under two adjacent control gate structures of FIG. 4, according to the prior art.

FIG. 6 shows the cross-sectional view of the flash memory cells formed by a fifth floating gate structure 230 under a third control gate structure 232 and by a sixth floating gate structure 234 under a fourth control gate structure 236, across dashed line B—B in FIG. 4. The flash memory cells of FIG. 6 include tunnel dielectric structures 238 and 240 that are similar to the tunnel dielectric structure 102 of FIG. 1, and include floating dielectric structures 242 and 244 that are similar to the floating dielectric structure 106 of FIG. 1.

Further referring to FIG. 6, a source bit line junction 246 is formed with the portion of the semiconductor substrate or p-well 103 disposed between the gate stacks formed by the third and fourth control gate structures 232 and 236. A drain bit line junction 248 for the fifth floating gate structure 230 is formed with the portion of the semiconductor substrate or p-well 103 disposed to the north of the third control gate structure 232 in FIG. 4. Similarly, a drain bit line junction 250 for the sixth floating gate structure 234 is formed with the portion of the semiconductor substrate or p-well 103 disposed to the south of the fourth control gate structure 236 in FIG. 4.

Referring to FIGS. 4 and 6, the source bit line junction for each of the floating gate structures disposed under the first and second control gate structures 212 and 214 is formed by the same portion of the semiconductor substrate or p-well 103 disposed between the first and second control gate structures 212 and 214. On the other hand, the drain bit line junction for a pair of floating gate structures disposed under the second and third control gate structures 214 and 234 and vertically aligned in a same column are formed by the same portion of the semiconductor substrate or p-well 103 disposed between the second and third control gate structures 214 and 232. An example drain contact structure 252 in FIG. 4 is disposed over such a drain bit line junction formed with the portion of the semiconductor substrate or p-well 103 disposed between the second and third control gate structures 214 and 232. Such a pattern of the drain and source bit line junctions repeats for each adjacent pair of control gate structures.

Each of the drain bit line junctions formed for a row of flash memory cells within the portion of the semiconductor substrate or p-well disposed between control gate structures are electrically isolated from each other by shallow trench isolation structures (not shown in FIG. 4 for clarity of illustration). The drain contact structures in FIG. 4 that are vertically aligned in a column are electrically coupled to form a bit line of the array of flash memory cells, whereas each control gate structure forms a word line of the array of flash memory cells.

In addition, the source bit line junction for each of the floating gate structures disposed under a pair of adjacent control gate structures is formed by the portion of the semiconductor substrate or p-well disposed between the pair of control gate structures. Source contact structures are periodically formed on the semiconductor substrate or p-well disposed between the pair of control gate structures to provide connection to the source bit line junction. Examples of such source contact structures include a first source contact structure 254 and a second source contact structure 256 formed periodically with four flash memory cells between each adjacent pair of source contact structures in FIG. 4.

Typically, more numerous flash memory cells are disposed between two adjacent source contact structures, but four flash memory cells are illustrated between two adjacent source contact structures for simplicity and clarity of illustration. In addition, FIG. 4 shows a portion of an array of flash memory cells for a flash memory device for simplicity and clarity of illustration. The pattern of flash memory cells of FIG. 4 repeats with more numerous control gate structures and floating gate structures for a larger array of flash memory cells for a typical non-volatile flash memory device.

Referring back to FIG. 4, a control gate structure bends to surround the larger area occupied by a source contact structure. For compact lay-out of the array of flash memory cells, the flash memory cells are formed to be relatively near each other. However, a contact structure typically requires a larger area than a flash memory cell. Thus, the control gate structures bend to surround the larger area occupied by source contact structures in FIG. 4.

Figure 7:
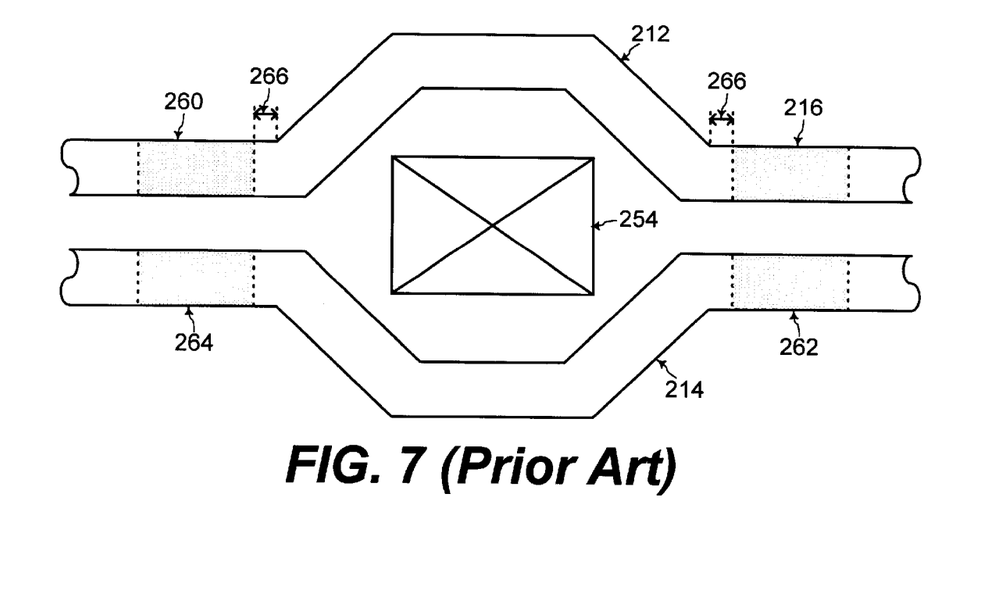
FIG. 7 shows an enlarged view of a source contact structure with proper alignment of the floating gate structures adjacent to the source contact structure, according to the prior art.

Referring to FIGS. 4 and 7, FIG. 7 shows an enlarged view of the first source contact structure 254 with bending of the gate stacks formed by the first and second control gate structures 212 and 214. The first floating gate structure 216 is formed to the right of the source contact structure 254 under the first control gate structure 212, and a seventh floating gate structure 260 is formed to the left of the source contact structure 254 under the first control gate structure 212. An eight floating gate structure 262 is formed to the right of the source contact structure 254 under the second control gate structure 214, and a ninth floating gate structure 264 is formed to the left of the source contact structure 254 under the second control gate structure 214.

When the floating gate structures in the array of flash memory cells are properly aligned, the first, seventh, eighth, and ninth floating gate structures 212, 260, 262, and 264 are disposed at a displacement distance 266 away from a gate stack bending point when the control gate structures 212 and 214 begin to bend. Each of the floating gate structures 212, 260, 262, and 264 are patterned to have a substantially same desired area. When the floating gate structures in the array of flash memory cells are properly aligned as illustrated in FIG. 7, each of the floating gate structures 212, 260, 262, and 264 have a substantially same desired area.

Figure 8:
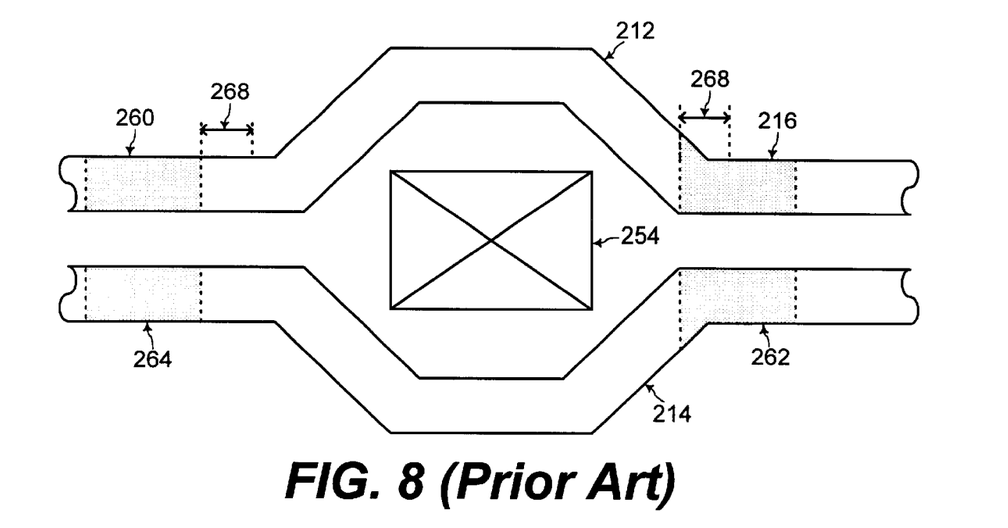
FIG. 8 shows the enlarged view of the source contact structure of FIG. 7 with misalignment of the floating gate structures adjacent to the source contact structure by being shifted too much to the left direction, according to the prior art.
Figure 9:
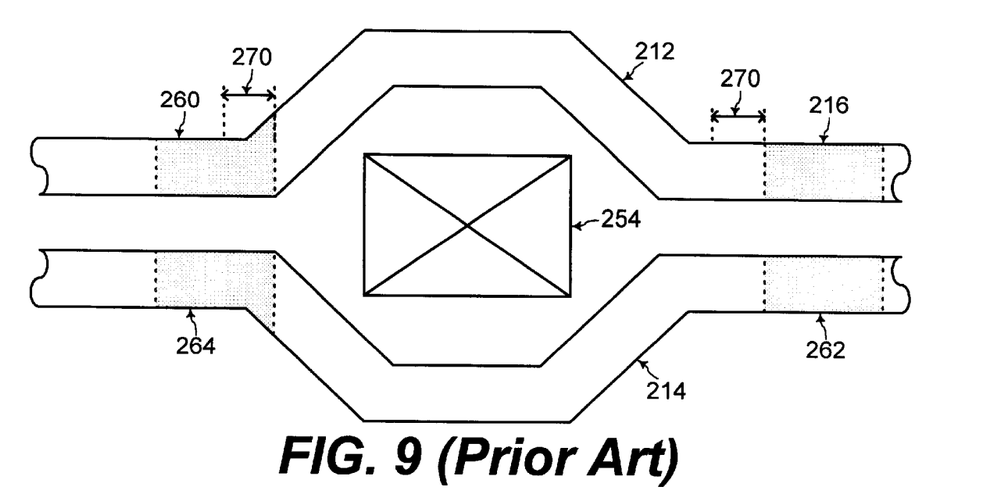
FIG. 9 shows the enlarged view of the source contact structure of FIG. 7 with misalignment of the floating gate structures adjacent to the source contact structure by being shifted too much to the right direction, according to the prior art.

On the other hand, referring to FIGS. 8 and 9, when the floating gate structures in the array of flash memory cells are not properly aligned, the areas of the floating gate structures are patterned into the bended portions of the control gate structures 212 and 214. In FIG. 8, the floating gate structures 216, 260, 262, and 264 are misaligned by being shifted too much to the left direction by a misalignment level of distance 268. In that case, the areas of floating gate structures 216 and 262 adjacent to the right of the source contact structure 254 occupy the bended portion of the control gate structures 212 and 214 to result in a larger area of each of the floating gate structures 216 and 262. On the other hand, in FIG. 9, the floating gate structures 216, 260, 262, and 264 are misaligned by being shifted too much to the right direction by a misalignment level of distance 270. In that case, the areas of floating gate structures 260 and 264 adjacent to the left of the source contact structure 254 occupy the bended portion of the control gate structures 212 and 214 to result in a larger area of each of the floating gate structures 260 and 264.

During an erase operation of the flash memory cells of the array of flash memory cells, charge carriers such as electrons are pulled out of the respective floating gate structure of each flash memory cell to decrease the threshold voltage of each flash memory cell. Typically, same bias voltages are applied at terminals of each of the flash memory cells of the array during this erase operation. A higher amount of charge carriers are pulled out of the floating gate structure of a flash memory cell when the area of the floating gate structure is larger to result in a lower threshold voltage when the charge carriers are electrons. However, a lower threshold voltage results in higher undesired leakage current of the flash memory cell, as known to one of ordinary skill in the art of non-volatile flash memory devices. Thus, referring to FIGS. 8 and 9, misalignment of the floating gate structures into the bended portion of the control gate structures with increase in area of the floating gate structures is undesired because of the increase in the leakage current for the flash memory cells formed by such floating gate structures.

Thus, a mechanism is desired for determining the level of misalignment of floating gate structures in an array of flash memory cells.

SUMMARY OF THE INVENTION

Accordingly, in a general aspect of the present invention, a plurality of test flash memory cells are formed to electrically determine the level of misalignment of floating gate structures closest to a gate stack bending point in an array of flash memory cells.

In one embodiment of the present invention, a plurality of test flash memory cells are formed with each test flash memory cell having a respective floating gate structure designed to be disposed at a respective displacement distance from a respective gate stack bending point. An erase operation is performed for each of the test flash memory cells by biasing the test flash memory cells with voltages from a plurality of voltage sources. Each of the test flash memory cells are then biased with test voltages from the plurality of voltage sources. A respective current meter then measures a respective amount of current flowing through each of the test flash memory cells when biased with the test voltages. The level of misalignment is determined depending on which of the test flash memory cells conducts a current level that is greater than a threshold current level when biased with the test voltages. The level of misalignment is approximately equal to a highest one of the respective displacement distance corresponding to one of the test flash memory cells that conducts a current level that is greater than the threshold current level.

For example, during the erase operation, the respective drain bit line junction and the respective source bit line junction of each of the test flash memory cells are floating while the respective control gate is biased with a negative voltage with respect to the substrate for each of the test flash memory cells. For the test voltages, the respective control gate, the respective substrate, and the respective source bit line junction are biased with substantially 0 volts while the respective drain bit line junction is biased with about 0.5 volts for each of the test flash memory cells.

The present invention may be used to particular advantage when the respective floating gate structure of each of the test flash memory cells is formed simultaneously with formation of the floating gate structures of the array of flash memory cells formed for a non-volatile flash memory device.

In another aspect of the present invention, a first plurality of test flash memory cells are formed with each of the first plurality of test flash memory cells having a respective floating gate structure designed to be disposed a respective displacement distance toward a first direction from a respective gate stack bending point. The level of misalignment to the first direction is determined depending on which of the first plurality of test flash memory cells conducts a current level that is greater than the threshold current level when biased with the test voltages. Similarly, a second plurality of test memory cells are formed with each of the second plurality of test flash memory cells having a respective floating gate structure designed to be disposed a respective displacement distance toward a second direction from a respective gate stack bending point. The level of misalignment to the second direction is determined depending on which of the second plurality of test flash memory cells conducts a current level that is greater than the threshold current level when biased with the test voltages.

In this manner, the test flash memory cells electrically indicate the level of misalignment of the floating gate structures closest to any gate stack bending point within an array of flash memory cells. Such a determination of the level of misalignment is useful for predicting the amount of leakage current through such flash memory cells within the array of flash memory cells. Such a determination may isolate the cause of defective flash memory devices to excessive current leakage of such flash memory cells.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1, 2, 3, 4, 5, 6, 7, 8, 9, 10, 11, 12, and 13 refer to elements having similar structure and function.

DETAILED DESCRIPTION OF THE INVENTION

Figure 10:
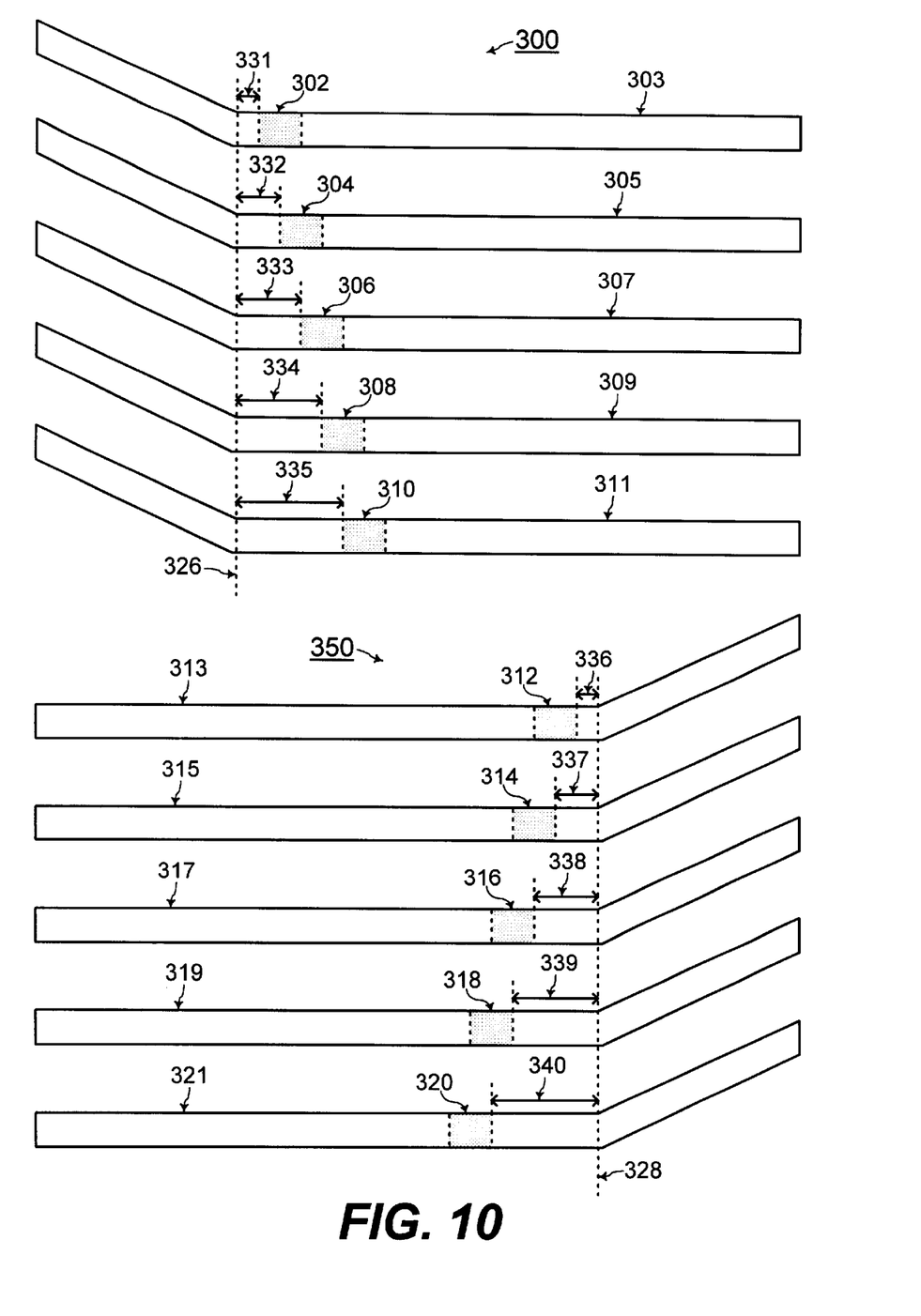
FIG. 10 shows test flash memory cells formed for electrically determining the level of misalignment of floating gate structures closest to a gate stack bending point in an array of flash memory cells, according to an embodiment of the present invention.

Referring to FIG. 10, a plurality of test flash memory cells are formed during fabrication of the array of flash memory cells of FIG. 4. Referring to FIG. 10, a first plurality of test flash memory cells 300 includes a first flash memory cell formed by a first floating gate structure 302 under a first control gate structure 303, a second flash memory cell formed by a second floating gate structure 304 under a second control gate structure 305, a third flash memory cell formed by a third floating gate structure 306 under a third control gate structure 307, a fourth flash memory cell formed by a fourth floating gate structure 308 under a fourth control gate structure 309, and a fifth flash memory cell formed by a fifth floating gate structure 310 under a fifth control gate structure 311.

Similarly, further referring to FIG. 10, a second plurality of test flash memory cells 350 includes a sixth flash memory cell formed by a sixth floating gate structure 312 under a sixth control gate structure 313, a seventh flash memory cell formed by a seventh floating gate structure 314 under a seventh control gate structure 315, an eighth flash memory cell formed by an eighth floating gate structure 316 under an eighth control gate structure 317, a ninth flash memory cell formed by a ninth floating gate structure 318 under a ninth control gate structure 319, and a tenth flash memory cell formed by a tenth floating gate structure 320 under a tenth control gate structure 321.

According to one embodiment of the present invention, the first and second plurality of test flash memory cells 300 and 350 are formed in a PCM (process control monitor) area of an integrated circuit die having the array of flash memory cells for a non-volatile memory device fabricated thereon. For example, the array of flash memory cells of FIG. 4 is fabricated simultaneously with the first and second plurality of test flash memory cells 300 and 350 of FIG. 10. In that case, the control gate structures of the first and second plurality of test flash memory cells 300 and 350 of FIG. 10 are formed simultaneously with the control gate structures of the array of flash memory cells of FIG. 4. In addition, the floating gate structures of the first and second plurality of test flash memory cells 300 and 350 of FIG. 10 are formed simultaneously with the floating gate structures of the array of flash memory cells of FIG. 4.

In addition, other regions of a flash memory cell similar to the tunnel gate dielectric 102, the floating gate dielectric 106, and the drain and source bit line junctions 110 and 114 of FIG. 1 are also formed for each flash memory cell of the first and second plurality of test flash memory cells 300 and 350. Fabrication processes for forming such structures of a flash memory cell are known to one of ordinary skill in the art of integrated circuit fabrication.

Further referring to FIG. 10, the respective floating gate structure of each of the plurality of test flash memory cells is disposed at a respective displacement distance from a gate stack bending point. In FIG. 10, the respective control gate structure of each of the plurality of test flash memory cells is formed to have a gate stack bending point where the gate stack formed with the control gate structure begins to bend. In FIG. 10, a first gate stack bending point for the first plurality of test flash memory cells 300 is marked by a first dashed line 326, and a second gate stack bending point for the second plurality of test flash memory cells 350 is marked by a second dashed line 328.

Referring to FIG. 10, the first floating gate structure 302 of the first test flash memory cell is designed to be disposed at a first displacement distance 331 from the first gate stack bending point 326. The second floating gate structure 304 of the second test flash memory cell is designed to be disposed at a second displacement distance 332 from the first gate stack bending point 326. The third floating gate structure 306 of the third test flash memory cell is designed to be disposed at a third displacement distance 333 from the first gate stack bending point 326. The fourth floating gate structure 308 of the fourth test flash memory cell is designed to be disposed at a fourth displacement distance 334 from the first gate stack bending point 326. The fifth floating gate structure 310 of the fifth test flash memory cell is designed to be disposed at a fifth displacement distance 335 from the first gate stack bending point 326.

Similarly, the sixth floating gate structure 312 of the sixth test flash memory cell is designed to be disposed at a sixth displacement distance 336 from the second gate stack bending point 328. The seventh floating gate structure 314 of the seventh test flash memory cell is designed to be disposed at a seventh displacement distance 337 from the second gate stack bending point 328. The eighth floating gate structure 316 of the eighth test flash memory cell is designed to be disposed at an eighth displacement distance 338 from the second gate stack bending point 328. The ninth floating gate structure 318 of the ninth test flash memory cell is designed to be disposed at a ninth displacement distance 339 from the second gate stack bending point 328. The tenth floating gate structure 320 of the tenth test flash memory cell is designed to be disposed at a tenth displacement distance 340 from the second gate stack bending point 328.

When the floating gate structures of the plurality of test flash memory cells 300 and 350 are formed simultaneously with the floating gate structures of the array of flash memory cells of FIG. 4, the level of misalignment of the plurality of test flash memory cells 300 and 350 indicates the level of misalignment of the floating gate structures of the array of flash memory cells of FIG. 4. Each of the floating gate structures 302, 304, 306, 308, 310, 312, 314, 316, 318, and 320 are disposed from a respective gate stack bending point with the respective displacement distance 331, 332, 333, 334, 335, 336, 337, 338, 339, and 340, respectively, when the floating gate structures of the plurality of test flash memory cells 300 and 350 are aligned properly with respect to the gate stack bending points 326 and 328.

In that case, referring to FIGS. 4, 7, and 10, each of the floating gate structures closest to a gate stack bending point near a source contact structure in the array of flash memory cells of FIG. 4 are disposed from a gate stack bending point by a displacement distance 266. Thus, the level of misalignment of the floating gate structures of the plurality of test flash memory cells 300 and 350 and of the array of flash memory cells of FIG. 4 is substantially zero in that case.

Figure 12:
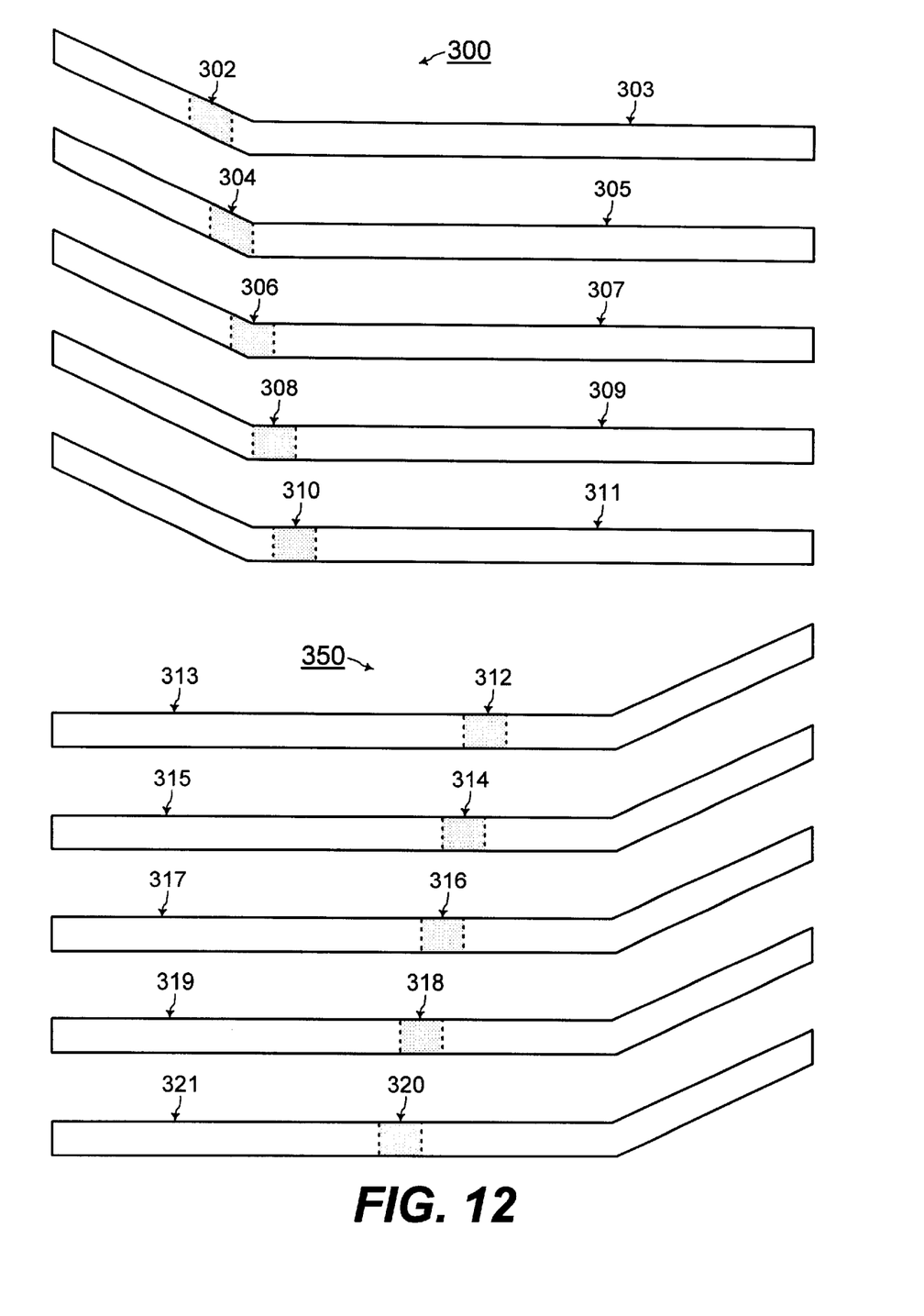
FIG. 12 shows the test flash memory cells of FIG. 10 with the floating gate structures of the test flash memory cells being shifted too much to the left direction, according to an embodiment of the present invention.

On the other hand, referring to FIGS. 4, 8, and 12, when the floating gate structures of the plurality of test flash memory cells 300 and 350 and of the array of flash memory cells of FIG. 4 are misaligned by being shifted too much to the left direction, the floating gate structures of the plurality of test flash memory cells 300 and 350 are no longer disposed from a respective gate stack bending point with the respective displacement distance. Rather, in FIG. 12, some of the floating gate structures of the first plurality of test flash memory cells 300 occupy the bended portion of the control gate structures. The bended portion of each of control gate structures of the first plurality of test flash memory cells 300 is the portion of the control gate structures disposed to the left of the first gate stack bending point 326.

Figure 13:
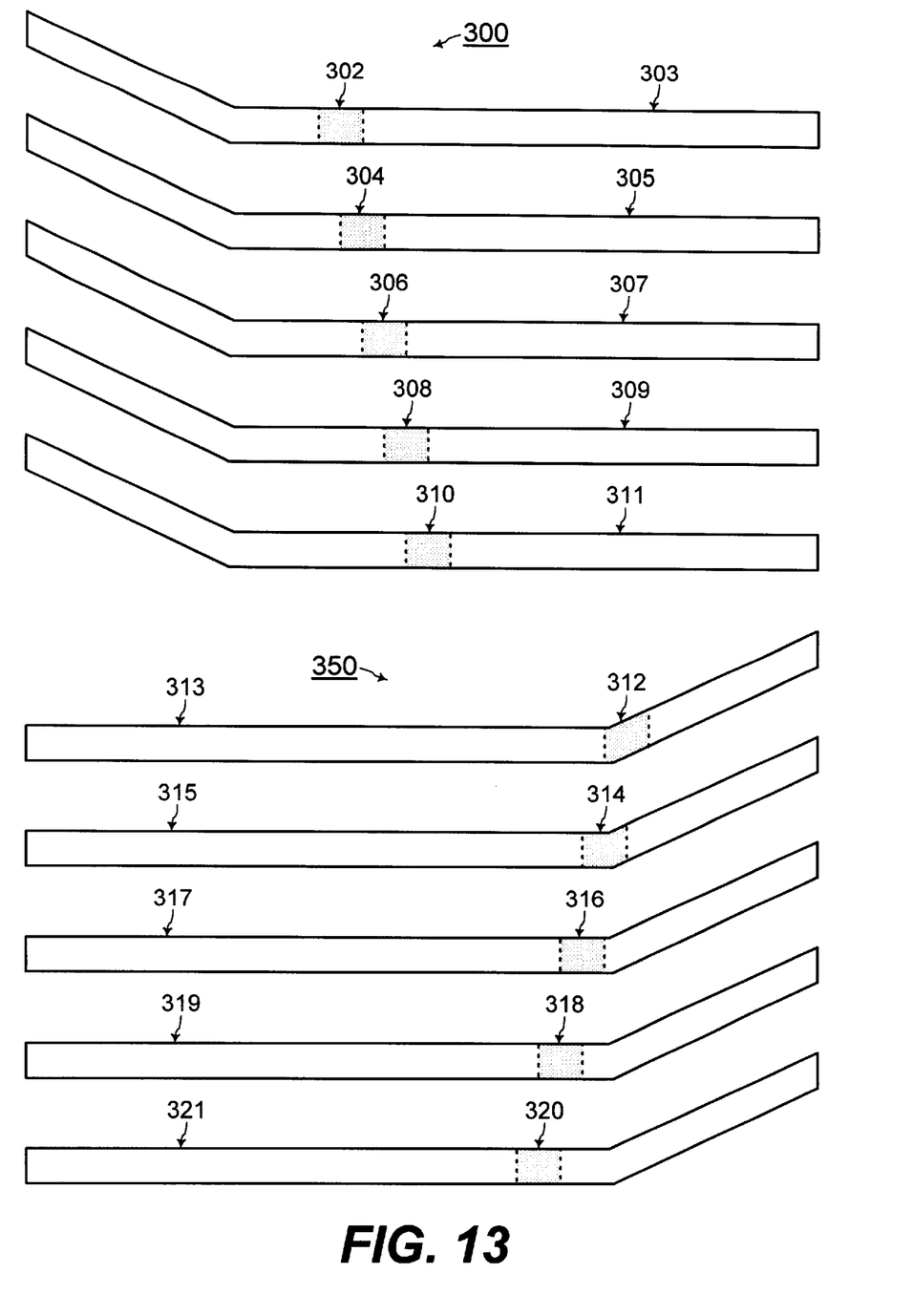
FIG. 13 shows the test flash memory cells of FIG. 10 with the floating gate structures of the test flash memory cells being shifted too much to the right direction, according to an embodiment of the present invention.

Similarly, referring to FIGS. 4, 9, and 13, when the floating gate structures of the plurality of test flash memory cells 300 and 350 and of the array of flash memory cells of FIG. 4 are misaligned by being shifted too much to the right direction, the floating gate structures of the plurality of test flash memory cells 300 and 350 are no longer disposed from a respective gate stack bending point with the respective displacement distance. Rather, in FIG. 13, some of the floating gate structures of the second plurality of test flash memory cells 350 occupy the bended portion of the control gate structures. The bended portion of each of control gate structures of the second plurality of test flash memory cells 350 is the portion of the control gate structures disposed to the right of the second gate stack bending point 328.

Figure 11:
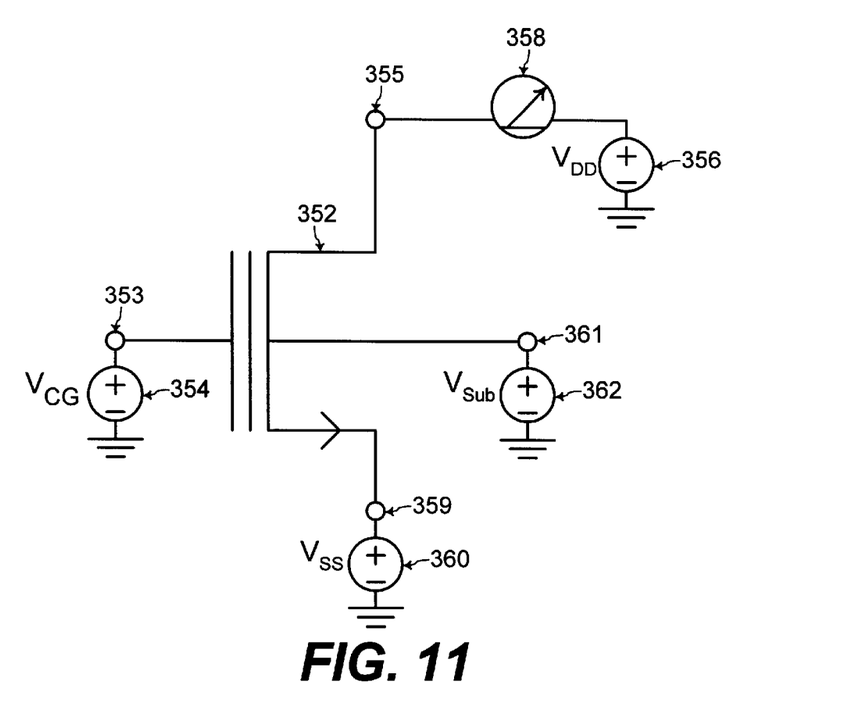
FIG. 11 shows voltage sources and a current meter coupled to an example test flash memory cell for determining the level of misalignment of the floating gate structures of the test flash memory cells, according to an embodiment of the present invention.

Referring to FIG. 11, for electrically determining the level of misalignment of the floating gate structures of the plurality of test flash memory cells 300 and 350 and of the array of flash memory cells of FIG. 4, each of the test flash memory cells is coupled to voltage sources and a respective current meter. FIG. 11 shows such voltage sources and a respective current meter coupled to an example test flash memory cell 352 which may be any one of the first and second plurality of test flash memory cells 300 and 350. The control gate structure 353 of the test flash memory cell 352 is coupled to a control gate voltage source 354. The drain bit line junction 355 of the test flash memory cell 352 is coupled to a drain voltage source 356 with a respective drain current meter 358 coupled in series between the drain bit line junction 355 and the drain voltage source 356. The source bit line junction 359 of the test flash memory cell 352 is coupled to a source voltage source 360. The substrate 361 of the test flash memory cell 352 is coupled to a substrate voltage source 362.

Each of the plurality of test flash memory cells 300 and 350 may be coupled to the same control gate voltage source 354, the drain voltage source 356, the source voltage source 360, and the substrate voltage source 362 as illustrated in FIG. 11. However, the drain bit line junction of each of the plurality of test flash memory cells 300 and 350 is coupled to a respective current meter for measuring the respective current level flowing through the drain bit line junction of each of the plurality of test flash memory cells.

The level of misalignment of the floating gate structures of the plurality of test flash memory cells 300 and 350 and of the array of flash memory cells of FIG. 4 is determined electrically according to a general aspect of the present invention. First, an erase operation is performed for each test flash memory cell of the first and second plurality of test flash memory cells 300 and 350. In one embodiment of the present invention, referring to FIG. 11, the drain bit line junction and the source bit line junction of each test flash memory cell are open-circuited to be floating. In addition, for the erase operation, a negative voltage of about voltage of −9.5 Volts is applied on the control gate structure by the control gate voltage source 354 while a voltage of +9 Volts is applied on the substrate with the substrate voltage source 360, for each of the test flash memory cells. With such bias during the erase operation, when the test flash memory cells are N-channel flash memory cells, electrons are pulled out of the respective floating gate structure to the substrate to decrease the threshold voltage of the test flash memory cells.

The floating gate structures 302, 304, 306, 308, 310, 312, 314, 316, 318, and 320 are comprised of polysilicon according to one embodiment of the present invention. The amount of electrons pulled out of such a floating gate structure during the erase operation increases for a larger area of the floating gate structure. The amount of electrons pulled out of the floating gate structure during the erase operation determines the level of the decrease in the threshold voltage of a flash memory cell.

In FIG. 10, when the floating gate structures of the plurality of test flash memory cells 300 and 350 are aligned properly with respect to the gate stack bending points 326 and 328, each of the floating gate structures 302, 304, 306, 308, 310, 312, 314, 316, 318, and 320 are not patterned with the bended portion of a control gate structure. Thus, each of the floating gate structures 302, 304, 306, 308, 310, 312, 314, 316, 318, and 320 have substantially the same area such that the amount of electrons pulled out of each of such floating gate structures during the erase operation is substantially the same for each test flash memory cell. In that case, the threshold voltage decreases by substantially the same amount for each test flash memory cell of FIG. 10.

In contrast, referring to FIG. 12, when the floating gate structures 302, 304, 306, 308, 310, 312, 314, 316, 318, and 320 are misaligned by being shifted too much to the left direction, the first, second, and third floating gate structures 302, 304, and 306 are patterned in the bended portion of the respective control gate structures 303, 305, and 307. The remaining floating gate structures 308, 310, 312, 314, 316, 318, and 320 are not patterned with the bended portion of the respective control gate structures 309, 311, 313, 315, 317, 319, and 321. Thus, the area of the first, second, and third floating gate structures 302, 304, and 306 are larger than the area of the remaining floating gate structures 308, 310, 312, 314, 316, 318, and 320. In that case, the threshold voltage of the flash memory cells having the first, second, and third floating gate structures 302, 304, and 306 is decreased more than that of the flash memory cells having the remaining floating gate structures 308, 310, 312, 314, 316, 318, and 320 after the erase operation.

Such a misalignment of the floating gate structures of FIG. 12 may be detected by measuring the current level flowing through each of the test flash memory cells of FIG. 12 after the erase operation. Referring to FIG. 12, test voltages are applied on each of the test flash memory cells formed by the floating gate structures 302, 304, 306, 308, 310, 312, 314, 316, 318, and 320 in FIG. 12. For example, referring to FIG. 11, in one embodiment of the present invention during such test biasing, a voltage of approximately 0 Volts is applied by the control gate voltage source 354 on the control gate structure 353, on the source bit line junction 359 by the source voltage source 360, and on the substrate 361 by the substrate voltage source 362 for each test flash memory cell. In addition, a voltage of approximately 0.5 Volts is applied on the drain bit line junction 355 by the drain voltage source 356 for each test flash memory cell.

With such test voltages during test biasing for each of the test flash memory cells formed by the floating gate structures 302, 304, 306, 308, 310, 312, 314, 316, 318, and 320 in FIG. 12, the respective amount of current flowing through each of such test flash memory cells is measured by the respective current meter 258. In FIG. 12, after the erase operation, each of the test flash memory cells formed by the first, second, and third floating gate structures 302, 304, and 306 have a lower respective threshold voltage than that of the test flash memory cells formed by the remaining floating gate structures 308, 310, 312, 314, 316, 318, and 320. Thus, the respective current measured through each of the test flash memory cells formed by the first, second, and third floating gate structures 302, 304, and 306 is greater than a threshold current level while the respective current measured through each of the test flash memory cells formed by the remaining floating gate structures 308, 310, 312, 314, 316, 318, and 320 is lower than the threshold current level.

In this manner, if any of the test memory cells formed with the first, second, third, fourth, or fifth floating gate structures 302, 304, 306, 308, and 310 (i.e., any of the first plurality of floating gate structures 300) has a measured current that is greater than the threshold current level, then the plurality of floating gate structures 300 and 350 of FIG. 12 are determined to be misaligned by being shifted too much in the left direction. Furthermore, the level of misalignment to the left direction is determined by which of the test memory cells formed with the first, second, third, fourth, or fifth floating gate structures 302, 304, 306, 308, and 310 has a respective measured current that is greater than the threshold current level.

For example, referring to FIG. 10, the first, second, third, fourth, or fifth floating gate structures 302, 304, 306, 308, and 310 are disposed at a respective distance from the first gate stack bending point 326 in increments of 0.1 μm (micrometer). Thus, the first floating gate structure 302 is designed to be disposed at the first displacement distance 331 that is 0.1 μm from the first gate stack bending point 326. The second floating gate structure 304 is designed to be disposed at the second displacement distance 332 that is 0.2 μm from the first gate stack bending point 326. The third floating gate structure 306 is designed to be disposed at the third displacement distance 333 that is 0.3 μm from the first gate stack bending point 326. The fourth floating gate structure 308 is designed to be disposed at the fourth displacement distance 334 that is 0.4 μm from the first gate stack bending point 326. The fifth floating gate structure 310 is designed to be disposed at the fifth displacement distance 335 that is 0.5 μm from the first gate stack bending point 326.

The level of misalignment is approximately equal to the highest one of the respective displacement distance corresponding to one of the test flash memory cells having a respective measured current that is greater than the threshold current level. Thus, the level of misalignment is determined to be approximately 0.1 μm to the left direction if only the test flash memory cell formed by the first floating gate structure 302 has a measured current level that is higher than the threshold current level. Alternatively, the level of misalignment is determined to be approximately 0.2 μm to the left direction if only the test flash memory cells formed by the first and second floating gate structures 302 and 304 each have a respective measured current level that is higher than the threshold current level. The level of misalignment is determined to be approximately 0.3 μm to the left direction if only the test flash memory cells formed by the first, second, and third floating gate structures 302, 304, and 306 each have a respective measured current level that is higher than the threshold current level. The level of misalignment is determined to be approximately 0.4 μm to the left direction if only the test flash memory cells formed by the first, second, third, and fourth floating gate structures 302, 304, 306, and 308 each have a respective measured current level that is higher than the threshold current level. The level of misalignment is determined to be approximately 0.5 μm to the left direction if all of the test flash memory cells formed by the first, second, third, fourth, and fifth floating gate structures 302, 304, 306, 308, and 310 each have a respective measured current level that is higher than the threshold current level.

Referring to the example of FIG. 12, the respective current measured through each of the test flash memory cells formed by the first, second, and third floating gate structures 302, 304, and 306 is greater than the threshold current level while the respective current measured through each of the test flash memory cells formed by the remaining floating gate structures 308, 310, 312, 314, 316, 318, and 320 is lower than the threshold current level. Thus, referring to FIGS. 10 and 12, the level of misalignment is determined to be approximately equal to 0.3 μm to the left direction in FIG. 12.

Similarly, referring to FIG. 13, when the floating gate structures 302, 304, 306, 308, 310, 312, 314, 316, 318, and 320 are misaligned by being shifted too much to the right direction, the sixth and seventh floating gate structures 312 and 314 are patterned in the bended portion of the respective control gate structures 313 and 315. The remaining floating gate structures 302, 304, 306, 308, 310, 316, 318, and 320 are not patterned with the bended portion of the respective control gate structures 303, 305, 307, 309, 311, 317, 319, and 321. Thus, the respective area of each of the sixth and seventh floating gate structures 312 and 314 are larger than the respective area of each of the remaining floating gate structures 302, 304, 306, 308, 310, 316, 318, and 320. In that case, after the erase operation, the threshold voltage of the flash memory cells having the sixth and seventh floating gate structures 312 and 314 is decreased more than that of the flash memory cells having the remaining floating gate structures 302, 304, 306, 308, 310, 316, 318, and 320.

After the erase operation, when the test voltages are applied on each of the test flash memory cells of FIG. 13, the respective current measured through each of the test flash memory cells formed by the sixth and seventh floating gate structures 312 and 314 is greater than the threshold current level while the respective current measured through each of the test flash memory cells formed by the remaining floating gate structures 302, 304, 306, 308, 310, 316, 318, and 320 is lower than the threshold current level.

In this manner, if any of the test memory cells formed with the sixth, seventh, eighth, ninth, and tenth floating gate structures 312, 314, 316, 318, and 320 (i.e., any of the second plurality of floating gate structures 350) has a measured current that is greater than the threshold current level, then the plurality of floating gate structures 300 and 350 of FIG. 13 are determined to be misaligned by being shifted too much in the right direction.

Furthermore, the level of misalignment to the right direction is determined by which of the test memory cells formed with the sixth, seventh, eighth, ninth, and tenth floating gate structures 312, 314, 316, 318, and 320 has a respective measured current that is greater than the threshold current level. The level of misalignment is approximately equal to the highest one of the respective displacement distance corresponding to one of the test flash memory cells having a respective measured current that is greater than the threshold current level.

Thus, the level of misalignment is determined to be approximately 0.1 μm to the right direction if only the test flash memory cell formed by the sixth floating gate structure 312 has a measured current level that is higher than the threshold current level. Alternatively, the level of misalignment is determined to be approximately 0.2 μm to the right direction if only the test flash memory cells formed by the sixth and seventh floating gate structures 312 and 314 each have a respective measured current level that is higher than the threshold current level. The level of misalignment is determined to be approximately 0.3 μm to the right direction if only the test flash memory cells formed by the sixth, seventh, and eighth floating gate structures 312, 314, and 316 each have a respective measured current level that is higher than the threshold current level. The level of misalignment is determined to be approximately 0.4 μm to the right direction if only the test flash memory cells formed by the sixth, seventh, eighth, and ninth floating gate structures 312, 314, 316, and 318 each have a respective measured current level that is higher than the threshold current level. The level of misalignment is determined to be approximately 0.5 μm to the right direction if all of the test flash memory cells formed by the sixth, seventh, eighth, ninth, and tenth floating gate structures 312, 314, 316, 318, and 320 each have a respective measured current level that is higher than the threshold current level.

Referring to the example of FIG. 13, the respective current measured through each of the test flash memory cells formed by the sixth and seventh floating gate structures 312 and 314 is greater than the threshold current level while the respective current measured through each of the test flash memory cells formed by the remaining floating gate structures 302, 304, 306, 308, 310, 316, 318, and 320 is lower than the threshold current level. Thus, referring to FIGS. 10 and 13, the level of misalignment is determined to be approximately equal to 0.2 μm to the right direction in FIG. 13.

Referring to FIG. 10, the floating gate structures are not misaligned to the right direction nor to the left direction such that the level of misalignment is substantially zero. In that case, the respective current measured through each of all of the floating gate structures 302, 304, 306, 308, 310, 312, 314, 316, 318, and 320 (i.e., both the first and second plurality of floating gate structures 300 and 350) is lower than the threshold current level indicating that the level of misalignment is substantially zero.

In this manner, the test flash memory cells of FIGS. 10, 12, and 13 electrically indicate the level of misalignment of the floating gate structures closest to any gate stack bending point within an array of flash memory cells. Such a determination of the level of misalignment is useful for predicting the amount of leakage current through such flash memory cells within the array of flash memory cells. Such a determination may isolate the cause of defective flash memory devices to excessive current leakage of such flash memory cells.

The foregoing is by way of example only and is not intended to be limiting. For example, the present invention may be practiced with more numerous test flash memory cells. However, ten test flash memory cells formed by ten floating gate structures are illustrated in FIGS. 10, 12, and 13 for clarity of illustration. In addition, any specified material, or any specified dimensions, or any specified voltage levels described herein are by way of example only. Other materials, dimensions, and voltage levels may be used for practicing the present invention, as would be apparent to one of ordinary skill in the art of non-volatile flash memory devices from the description herein.

Furthermore, as will be understood by those skilled in the art, the structures described herein may be made or used in the same way regardless of their position and orientation. Accordingly, it is to be understood that terms and phrases such as "left," "right," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A method for determining a level of misalignment of floating gate structures closest to a gate stack bending point in an array of flash memory cells, the method including the steps of:

A. forming a plurality of test flash memory cells, with each test flash memory cell having a respective floating gate structure designed to be disposed a respective displacement distance from a respective gate stack bending point;

B. performing an erase operation for each of said test flash memory cells;

C. biasing each of said test flash memory cells with test voltages;

D. measuring a respective amount of current flowing through each of said test flash memory cells when biased with said test voltages; and E. determining said level of misalignment depending on which of said test flash memory cells conducts a current level that is greater than a threshold current level when biased with said test voltages;

wherein said level of misalignment is approximately equal to a highest one of said respective displacement distance corresponding to one of said test flash memory cells that conducts the current level that is greater than said threshold current level.

2. The method of claim 1, wherein said gate stack bending point in said array of flash memory cells is adjacent a source contact structure.

3. The method of claim 1, wherein said respective floating gate structure of each of said test flash memory cells is formed simultaneously with formation of said floating gate structures of said array of flash memory cells.

4. The method of claim 1, wherein said respective floating gate structure of each of said test flash memory cells is comprised of polysilicon.

5. The method of claim 1, wherein each of said test flash memory cells has a respective drain bit line junction, a respective source bit line junction, a respective substrate, and a respective control gate, and wherein said step B further includes the steps of:

floating said respective drain bit line junction and said respective source bit line junction of each of said test flash memory cells; and biasing said respective control gate with a negative voltage with respect to said respective substrate for each of said test flash memory cells.

6. The method of claim 1, wherein each of said test flash memory cells has a respective drain bit line junction, a respective source bit line junction, a respective substrate, and a respective control gate, and wherein said step C further includes the steps of:

biasing said respective control gate, said respective substrate, and said respective source bit line junction with substantially 0 volts for each of said test flash memory cells; and biasing said respective drain bit line junction with about 0.5 volts for each of said test flash memory cells.

7. The method of claim 1, wherein said respective displacement distance is successively increased by increments of 0.1 micrometers from said respective gate stack bending point for each of said test flash memory cells.

8. The method of claim 1, wherein none of said test flash memory cells conducts a current level that is greater than said threshold current level when biased with said test voltages to indicate that said level of misalignment is approximately zero.

9. The method of claim 1, further including the steps of:

forming a first plurality of test flash memory cells with each of said first plurality of test flash memory cells having a respective floating gate structure designed to be disposed a respective displacement distance toward a first direction from the respective gate stack bending point;

determining said level of misalignment to said first direction depending on which of said first plurality of test flash memory cells conducts a current level that is greater than said threshold current level when biased with said test voltages;

forming a second plurality of test flash memory cells with each of said second plurality of test flash memory cells having a respective floating gate structure designed to be disposed a respective displacement distance toward a second direction from the respective gate stack bending point; and determining said level of misalignment to said second direction depending on which of said second plurality of test flash memory cells conducts a current level that is greater than said threshold current level when biased with said test voltages.

10. A system for determining a level of misalignment of floating gate structures closest to a gate stack bending point in an array of flash memory cells, the system comprising:

a plurality of test flash memory cells, with each test flash memory cell having a respective floating gate structure designed to be disposed a respective displacement distance from a respective gate stack bending point;

voltage sources for providing voltages on a respective drain bit line junction, a respective source bit line junction, a respective control gate, and a respective substrate of each of said test flash memory cells during an erase operation for each of said test flash memory cells;

wherein said voltage sources provide testing voltages on said respective drain bit line junction, said respective source bit line junction, said respective control gate, and said respective substrate of each of said test flash memory cells during test biasing of each of said test flash memory cells; and a respective current meter for measuring a respective amount of current flowing through each of said test flash memory cells when biased with said test voltages;

wherein said level of misalignment is determined from which of said test flash memory cells conducts a current level that is greater than a threshold current level when biased with said test voltages;

and wherein said level of misalignment is approximately equal to a highest one of said respective displacement distance corresponding to one of said test flash memory cells that conducts the current level that is greater than said threshold current level.

11. The system of claim 10, wherein said gate stack bending point in said array of flash memory cells is adjacent a source contact structure.

12. The system of claim 10, wherein said respective floating gate structure of each of said test flash memory cells is formed simultaneously with formation of said floating gate structures of said array of flash memory cells.

13. The system of claim 10, wherein said respective floating gate structure of each of said test flash memory cells is comprised of polysilicon.

14. The system of claim 10, wherein said respective drain bit line junction and said respective source bit line junction of each of said test flash memory cells are floating, and wherein said respective control gate is biased with a negative voltage with respect to said respective substrate for each of said test flash memory cells, during said erase operation.

15. The system of claim 10, wherein said respective control gate, said respective substrate, and said respective source bit line junction are biased with substantially 0 volts for each of said test flash memory cells, and wherein said respective drain bit line junction is biased with about 0.5 volts for each of said test flash memory cells, during said test biasing.

16. The system of claim 10, wherein said respective displacement distance is successively increased by increments of 0.1 micrometers from said respective gate stack bending point for each of said test flash memory cells.

17. The system of claim 10, wherein none of said test flash memory cells conducts a current level that is greater than said threshold current level when biased with said test voltages to indicate that said level of misalignment is approximately zero.

18. The system of claim 10, further comprising:

a first plurality of test flash memory cells with each of said first plurality of test flash memory cells having a respective floating gate structure designed to be disposed a respective displacement distance toward a first direction from the respective gate stack bending point;

wherein said level of misalignment to said first direction is determined from which of said first plurality of test flash memory cells conducts a current level that is greater than said threshold current level when biased with said test voltages; and a second plurality of test flash memory cells with each of said second plurality of test flash memory cells having a respective floating gate structure designed to be disposed a respective displacement distance toward a second direction from the respective gate stack bending point;

and wherein said level of misalignment to said second direction is determined from which of said second plurality of test flash memory cells conducts a current level that is greater than said threshold current level when biased with said test voltages.

19. A system for determining a level of misalignment of floating gate structures closest to a gate stack bending point in an array of flash memory cells, the system comprising:

a plurality of test flash memory cells, with each test flash memory cell having a respective floating gate structure designed to be disposed a respective displacement distance from a respective gate stack bending point;

means for performing an erase operation for each of said test flash memory cells;

means for biasing each of said test flash memory cells with test voltages; and means for measuring a respective amount of current flowing through each of said test flash memory cells when biased with said test voltages;

wherein said level of misalignment is approximately equal to a highest one of said respective displacement distance corresponding to one of said test flash memory cells that conducts a current level that is greater than a threshold current level.

20. The system of claim 19, wherein said respective floating gate structure of each of said test flash memory cells is formed simultaneously with formation of said floating gate structures of said array of flash memory cells.

21. The system of claim 19, wherein said respective displacement distance is successively increased by increments of 0.1 micrometers from said respective gate stack bending point for each of said test flash memory cells.

22. The system of claim 19, further comprising:

a first plurality of test flash memory cells with each of said first plurality of test flash memory cells having a respective floating gate structure designed to be disposed a respective displacement distance toward a first direction from the respective gate stack bending point;

wherein said level of misalignment to said first direction is determined from which of said first plurality of test flash memory cells conducts a current level that is greater than said threshold current level when biased with said test voltages; and a second plurality of test flash memory cells with each of said second plurality of test flash memory cells having a respective floating gate structure designed to be disposed a respective displacement distance toward a second direction from the respective gate stack bending point;

and wherein said level of misalignment to said second direction is determined from which of said second plurality of test flash memory cells conducts a current level that is greater than said threshold current level when biased with said test voltages.

* * * * *